United States Patent
Zimmermann et al.

(10) Patent No.: US 6,816,428 B2
(45) Date of Patent: Nov. 9, 2004

(54) ARRANGEMENT FOR VOLTAGE SUPPLY TO A VOLATILE SEMICONDUCTOR MEMORY

(75) Inventors: Christian Zimmermann, Tübingen (DE); Axel Aue, Korntal-Muenchingen (DE); Juergen Spachmann, Sersheim (DE)

(73) Assignee: Robert Bosch GmbH, Stuggart (DE)

(*) Notice: Subject to any disclaimer, the term of this patent is extended or adjusted under 35 U.S.C. 154(b) by 0 days.

(21) Appl. No.: 10/169,446

(22) PCT Filed: Dec. 29, 2000

(86) PCT No.: PCT/DE00/04636

§ 371 (c)(1),
(2), (4) Date: Nov. 12, 2002

(87) PCT Pub. No.: WO01/50473

PCT Pub. Date: Jul. 12, 2001

(65) Prior Publication Data
US 2003/0123218 A1 Jul. 3, 2003

(30) Foreign Application Priority Data
Dec. 30, 1999  (DE) .......................................... 199 64 018

(51) Int. Cl.$^7$ ................................................. G11C 7/00
(52) U.S. Cl. ........................................ 365/226; 365/227
(58) Field of Search ................................. 365/226, 227, 365/228, 229; 307/66, 130; 323/282

(56) References Cited

U.S. PATENT DOCUMENTS

| 5,073,837 A | * 12/1991 | Baek ............................ 361/92 |
| 5,182,468 A | 1/1993 | Erdelyi et al. |
| 5,430,365 A | * 7/1995 | Taylor et al. ............... 323/273 |

FOREIGN PATENT DOCUMENTS

| EP | 0 871 178 | 10/1998 |
| FR | 2 738 682 | 3/1997 |

* cited by examiner

Primary Examiner—Son Mai
(74) Attorney, Agent, or Firm—Kenyon & Kenyon

(57) ABSTRACT

A system for supplying power to a volatile semiconductor memory having a memory array, with the semiconductor memory being provided with a standby voltage that is present at a second connection of the semiconductor memory. To implement the power supply system as simply and with as few components as possible, the semiconductor memory is provided with a stabilization circuit for stabilizing the standby voltage that has a low impedance when the input voltage is elevated and a high impedance when the input voltage is too low to supply the semiconductor memory.

9 Claims, 2 Drawing Sheets

ARRANGEMENT FOR VOLTAGE SUPPLY TO A VOLATILE SEMICONDUCTOR MEMORY

FIELD OF THE INVENTION

The present invention relates to a system for supplying power to a volatile semiconductor memory having a memory array, with an input voltage being present at a second connection of the semiconductor memory.

BACKGROUND INFORMATION

Semiconductor memories are divided into two groups: volatile and non-volatile memories. Volatile memories (temporary memories) can be read and written any number of times and are therefore known, for example, as random access memories (RAM). The information that they contain is lost when the supply voltage is cut off. Non-volatile memories (permanent memories) retain their information contents even after the supply voltage has been cut off and are also known as read-only memories.

A volatile semiconductor memory is part, for example, of a microcomputer. A program that can be processed by the microcomputer is stored in the memory array of the semiconductor memory. If the microcomputer is part of a controller for a motor vehicle, for example as part of an engine controller, the information contained in the memory array must remain permanently stored even after the motor vehicle has been turned off. For this purpose, the semiconductor memory is provided with a supply voltage that is permanently present at the semiconductor memory, i.e., particularly even when the motor vehicle is turned off.

The permanent voltage for permanent storage of the information contained in the memory array is supplied, in particular, from the vehicle battery and causes the vehicle battery to discharge slowly, due to quiescent current consumption. In addition, the current consumption of the semiconductor memory during the continuously supplied quiescent phase differs by multiple powers of ten from the current consumption during normal operation, when read and write access takes place. A complex system having two circuit segments having different drive capacities for quiescent mode and normal mode is therefore usually provided to supply power to the semiconductor memory. Switching between the two circuit segments occurs as needed. To minimize quiescent current consumption, the circuit segment having the high drive capacity for normal operation must be deactivated when the motor vehicle is at a standstill, since the vehicle battery would otherwise be quickly drained. In conventional designs, the circuit segment having the low drive capacity for the quiescent phase is nevertheless so complex that it consumes quiescent current at levels of, for example, several hundred microamperes.

The circuit segment having the low drive capacity must stabilize the input voltage, i.e., standby voltage, of the semiconductor memory to prevent fluctuations, particularly a decrease, in the supply voltage of the memory array from resetting the semiconductor memory, thus causing a complete loss of the information stored in the memory array. In addition, the circuit segment having the low drive capacity should protect the memory array against overvoltage pulses to avoid damaging the memory array, which would cause information to be lost.

SUMMARY

An object of the present invention is to provide a system for supplying power to a semiconductor memory as simply and with as few components as possible, thereby minimizing quiescent current consumption in the system.

According to the present invention, this object may be achieved on the basis of the power supply system by providing the semiconductor memory with a stabilization circuit for stabilizing the input voltage, i.e., standby voltage, that has a low impedance when the input voltage (V_STBY) is elevated and a high impedance when the input voltage (V_STBY) is too low to supply power to the semiconductor memory (1, 1a).

In particular, this may be achieved according to the present invention by using a parallel circuit of a diode and a transistor, with the diode being connected by its anode to the input voltage, i.e., standby voltage, and by its cathode to a reference potential that is present at a third connection of the semiconductor memory; and with the transistor being connected by its junction, i.e., the drain/source channel in the case of a field-effect transistor (FET) or the emitter-collector junction in the case of a bipolar transistor, between the standby voltage and the reference potential, and the base of the transistor, i.e., the gate in the case of a field-effect transistor (FET) or the base in the case of a bipolar transistor, being connected to the input, i.e., standby, voltage. The terms input voltage and standby voltage are used interchangeably in the discussion below.

The system according to the present invention has a stabilization circuit of an especially simple design.

According to an example embodiment, the system includes only a diode and a transistor, which are connected to each other in a manner suitable for optimum stabilization of the standby voltage. The stabilization circuit in the system according to the present invention is integrated into the semiconductor memory. The system according to the present invention makes use of the fact that the stability of the standby voltage needs to meet only relatively minor requirements to ensure that the information remains stored in the memory array.

Other implementations of the stabilization circuit include use of a Zener diode, a voltage-dependent conductivity controller of a CMOS transistor or a temperature-compensated, voltage-dependent conductivity controller.

Because the stabilization circuit has a simple structure and a small number of components, an especially low working current may be selected for stabilizing the supply voltage during the semiconductor memory quiescent phase, which makes it possible to minimize quiescent current consumption. As a result, an especially small amount of current is drawn from the vehicle battery during the semiconductor memory quiescent phase, thus protecting the battery.

The diode of the stabilization circuit may be designed as a Zener diode. The transistor of the stabilization circuit may be designed as a FET, in particular a MOSFET. The transistor may be designed as an n-channel field-effect transistor.

According to an embodiment of the present invention, the second connection of the semiconductor memory can be connected to a supply voltage source via a resistor. The supply voltage source is designed, for example, as a car battery. A portion of the supply voltage decreases over the resistor, and the standby voltage is present at the second connection of the semiconductor memory. In the system according to the present invention, a resistor having a particularly high impedance may be selected, since the stabilization circuit requires only a very low working current to stabilize the standby voltage.

To smooth the standby voltage and bridge short-term dips in the supply voltage, the second connection of the semiconductor memory may be connected to the reference potential via a capacitor.

The semiconductor memory may include a protective circuit that has multiple series-connected clamping elements and is arranged between the standby voltage and the reference potential according to a further embodiment of the present invention. This protective circuit helps protect the memory array against overvoltage pulses. The clamping voltage of the protective circuit may be set by selecting a suitable number of clamping elements.

The clamping elements are advantageously designed as transistors that are series-connected to each other via the drain/source channel, with the gate of each transistor being connected to either the drain or the source of its own transistor. The transistors of the protective circuit may be designed as MOSFETs. The transistors of the protective circuit may be designed as n-channel field-effect transistors.

DETAILED DESCRIPTION

Figure 1:
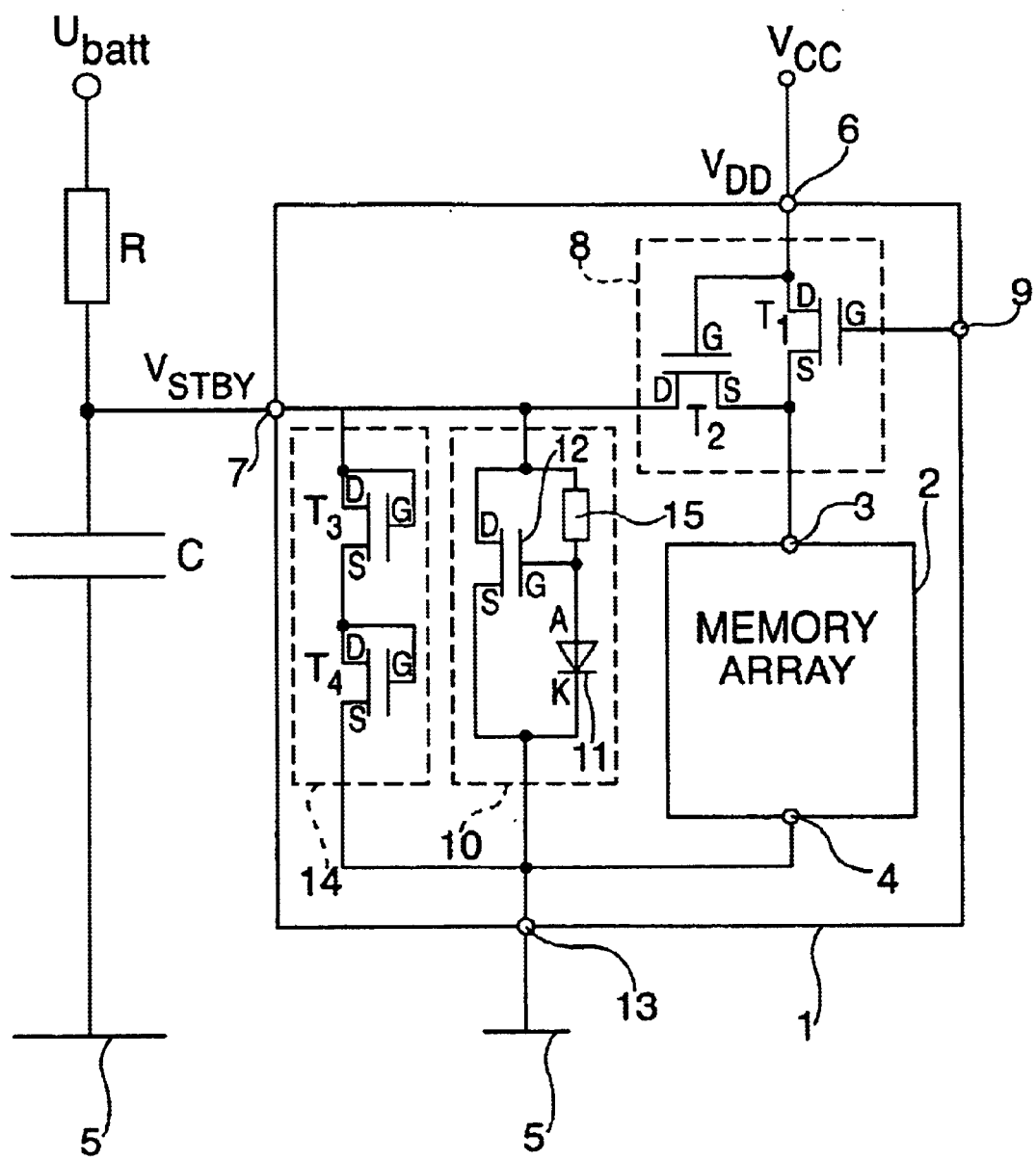
FIG. 1 shows a system according to the present invention for supplying power to a volatile semiconductor memory.

In FIG. 1, a volatile semiconductor memory is represented in its entirety by reference number 1. Semiconductor memory 1 has a memory array 2 in which are provided a plurality of memory cells in the form of a matrix. To select a specific memory cell for the purpose of writing information to the memory cell or reading the contents of the memory cell, the memory cell address is decoded by a column or line decoder.

Volatile semiconductor memory 1 forms part of a microcomputer (not illustrated). The microcomputer, in turn, is part of a controller for a motor vehicle, for example part of an engine controller. A control program that is processible by the microcomputer is stored in memory array 2 of semiconductor memory 1. To prevent the loss of the control program when the motor vehicle is turned off, the information contained in memory array 2 is permanently stored even after the motor vehicle has been turned off. For this purpose, memory array 2 is provided with a supply voltage that is permanently present, i.e., particularly even when the motor vehicle is turned off. The supply voltage is present at a first connection 3 of memory array 2. A further connection 4 of memory array 2 is connected to a reference potential 5.

The current consumption of semiconductor memory 1 during the continuously supplied quiescent phase differs by multiple powers of ten from the current consumption during normal operation, when read and write access takes place. A system having two circuit segments having different drive capacities for quiescent mode and normal mode is therefore provided to supply power to semiconductor memory 1. In the present exemplary embodiment, operating voltage V_DD for normal operation corresponds to voltage V_CC generated internally in the controller. Standby voltage V_STBY for the quiescent phases is present at a second connection 7 of semiconductor memory 1. Standby voltage V_STBY corresponds to battery voltage U_batt, which is reduced by a decreasing voltage at a resistor R.

If necessary, a switching system 8 is used to switch between the two circuit segments, i.e., between operating voltage (V_DD) and standby voltage (V_STBY). To minimize quiescent current consumption, the circuit segment having the high drive capacity for normal operation must be deactivated when the motor vehicle is at a standstill, since the vehicle battery would otherwise be quickly drained. Switching system 8 has two transistors T_1, T_2. First transistor T_1 (n-channel transistor) is connected by its drain/source channel DS between operating voltage V_DD and first connection 3 of memory array 2 for the supply voltage and by its gate G to a fourth terminal 9 of semiconductor memory 1. A switching signal for switching the supply voltage is present at fourth connection 9. An internal voltage of the controller may be used as the switching signal, causing operating voltage V_DD to automatically switch to standby voltage V_STBY when the controller is turned off. Second transistor T_2 is connected by its drain/source channel DS between first connection 3 of memory array 2 and second connection 7 of semiconductor memory 1 and by its gate G to first connection 6 of semiconductor memory 1.

A stabilization circuit 10 for stabilizing the input voltage, i.e., standby voltage V_STBY, is provided in semiconductor memory 1. Stabilization circuit 10 includes a parallel circuit of a diode 11 and a transistor 12. Diode 11 is connected by its anode A to second connection 7 of semiconductor memory 1 via a resistor 15 and by its cathode K to the reference potential via a third connection 13 of semiconductor memory 1. Diode 11 is designed as a Zener diode in this depicted embodiment. Transistor 12 is connected by its drain/source channel DS between second connection 7 and third connection 13 of semiconductor memory 1 and by its gate G to second connection 7 of semiconductor memory 1 via resistor 15. Transistor 12 is designed as an n-channel MOSFET in the depicted embodiment.

To smooth the input voltage, i.e., standby voltage V_STBY, and to bridge short-term dips in battery voltage U_batt, second connection 7 of semiconductor memory 1 is connected to reference potential 5 via a capacitor C.

To protect memory array 2 against overvoltage pulses, semiconductor memory 1 is provided with a protective circuit 14 that includes two series-connected transistors T_3, T_4. Transistors T_3, T_4 are series-connected to each other via drain/source channel DS between second connection 7 and third connection 13 of semiconductor memory 1. Gate G of each transistor T_3, T_4 is connected to either drain D or source S of its own transistor T_3; T_4. Transistors T_3, T_4 of protective circuit 14 may be designed as n-channel MOSFETs.

Figure 2:
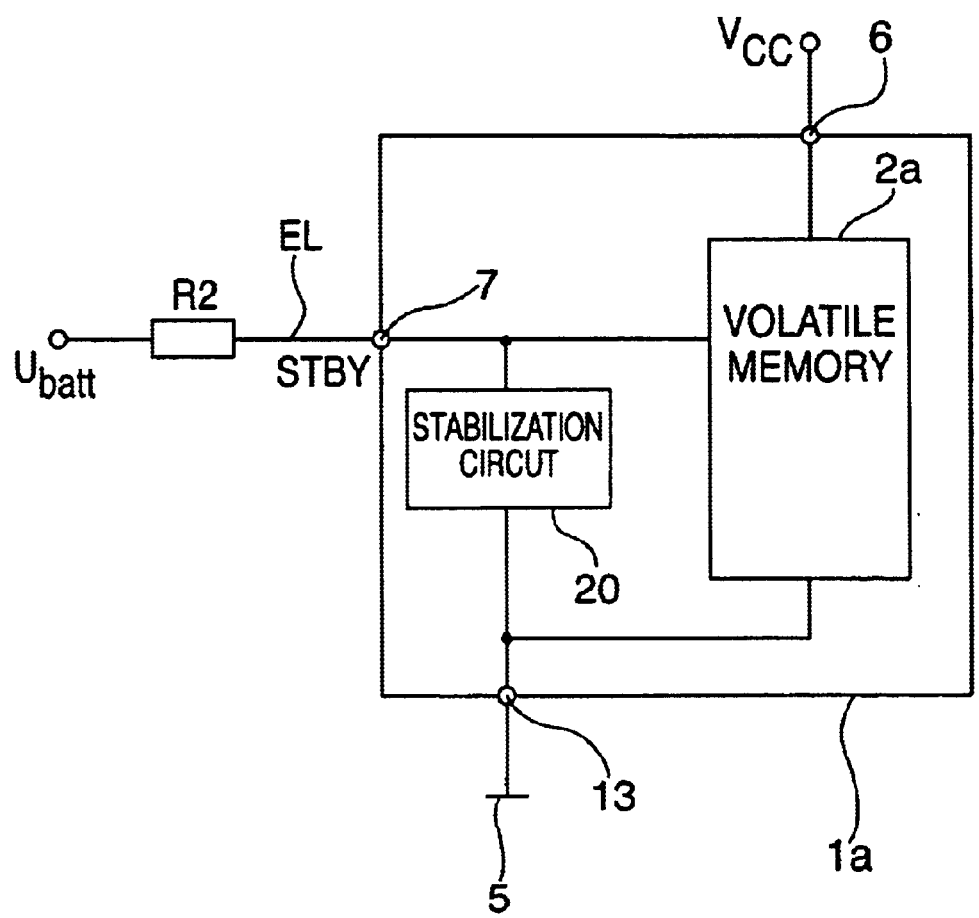
FIG. 2 shows general schematic representation of an embodiment of the system of the present invention.

FIG. 2 shows a general schematic representation of the system according to the present invention. U_batt again represents the supply voltage source, for example in the form of a battery or battery voltage. This supply voltage may be present in the form of an unstabilized supply voltage, which further reduces the complexity.

Reference number R2 in FIG. 2 represents a load, in particular a resistor. The latter is connected to stabilization circuit 20 via an input line EL leading to memory circuit 1a. In a more general representation, the memory circuit corresponds to semiconductor memory 1, which merely represents a more concrete exemplary embodiment of the object of the present invention. Reference number 2a represents a more general form of the volatile memory itself, in particular in the form of RAM (random access memory), which, in this representation, may also include circuit segments in addition to memory array 2, such as switching system 8 from FIG. 1.

Input voltage V_STBY at point 7 is reduced by drawing a higher current over resistor R2. Input voltage V_STBY at point 7 in FIG. 2 is measured. If input voltage V_STBY via EL exceeds a predefinable or specific value, stabilization circuit 20 takes on a low impedance, causing more current to be drawn and producing a decrease in a higher voltage over resistor R2. This reduces input voltage V_STBY.

If input voltage V_STBY is too low to supply internal volatile memory 2a, stabilization circuit 20 takes on a high impedance, causing the voltage at input (7) V_STBY to rise again, since less voltage is decreasing over resistor R2.

Stabilization circuit 20, like circuit 10 in FIG. 1, thus generally operates by taking on a low impedance when input voltage V_STBY is elevated and a high impedance when input voltage V_STBY is too low.

This functionality is also achievable with circuit 10, for example by using a Zener diode, a voltage-dependent conductivity controller of a CMOS transistor, a temperature-compensated, voltage-dependent conductivity controller and the like.

The object of the present invention is therefore achievable with different circuits, which is why the design of the present invention is not limited to the exemplary embodiments described above. Instead, a number of variations are possible which make use of the principles of the present invention described above when implemented in different designs.

What is claimed is:

1. A system for supplying power to a volatile semiconductor memory having a memory array with an input voltage being applied to a connection of the semiconductor memory, the system comprising:

a stabilization circuit provided for the semiconductor memory configured to stabilize the input voltage, the stabilization circuit having a low impedance when the input voltage is elevated and a high impedance when the input voltage is too low to supply the semiconductor memory, wherein the stabilization circuit includes a parallel circuit of a diode and a transistor, the diode having an anode and a cathode, the anode being connected to the input voltage and the cathode being connected to a reference potential provided at a further connection of the semiconductor memory, the transistor having a function and a base, the function being connected between the input voltage and the reference potential, and the base being connected to the input voltage; and a protective circuit provided for the semiconductor memory, the protective circuit including multiple clamping elements connected in series, the multiple clamping elements being arranged between the input voltage and the reference potential.

2. The system of claim 1, further comprising:

a switching system configured to switch the input voltage, the switching system being arranged between an operating voltage which is provided at a first connection of the semiconductor memory, and the input voltage which is provided at a second connection of the semiconductor memory.

3. The system of claim 1, wherein the diode is a Zener diode.

4. The system of claim 1, wherein the connection of the semiconductor memory is connected to a supply voltage via a resistor.

5. The system of claim 1, wherein the connection of the semiconductor memory is connected to a reference potential via a capacitor.

6. The system of claim 1, wherein the multiple clamping elements include multiple transistors, each of the transistors having a drain, a source and a base, the drain and the source being arranged to form a junction, the multiple transistors being connected in series to each other via their respective junctions, the base of each transistor being connected to one of its respective drain and source.

7. The system of claim 6, wherein at least one of the transistor of the stabilization circuit and the multiple transistors of the protective circuit is implemented as one of a field-effect transistor (MOSFET) and a bipolar transistor.

8. The system of claim 6, wherein at least one of the transistor of the stabilization circuit and the multiple transistors of the protective circuit is implemented as an n-channel field-effect transistor.

9. The system of claim 1, wherein:

a) the stabilization circuit includes a Zener diode, b) the stabilization circuit is designed as a voltage-dependent conductivity controller of a transistor, or c) the stabilization circuit is designed as a temperature-compensated, voltage-dependent conductivity controller.

* * * * *